US008957698B2

(12) United States Patent
     Cop (10) Patent No.: US 8,957,698 B2
(45) Date of Patent: Feb. 17, 2015

(54) METHOD AND APPARATUS FOR OFF-LINE TESTING OF MULTI-PHASE ATERNATING CURRENT MACHINES

(75) Inventor: Boris Cop, Helsingborg (SE)

(73) Assignee: Subsee RAA AB, Raa (SE)

( * ) Notice: Subject to any disclaimer, the term of this patent is extended or adjusted under 35 U.S.C. 154(b) by 796 days.

(21) Appl. No.: 13/129,231

(22) PCT Filed: Nov. 13, 2009

(86) PCT No.: PCT/SE2009/051296
§ 371 (c)(1),
(2), (4) Date: Aug. 31, 2011

(87) PCT Pub. No.: WO2010/056197
PCT Pub. Date: May 20, 2010

(65) Prior Publication Data
US 2011/0304351 A1    Dec. 15, 2011

Related U.S. Application Data

(60) Provisional application No. 61/114,173, filed on Nov. 13, 2008.

(30) Foreign Application Priority Data

Nov. 13, 2008    (SE) ...................................... 0802394

(51) Int. Cl.
*G01R 31/34*    (2006.01)

(52) U.S. Cl.
CPC ...................................... *G01R 31/34* (2013.01)
USPC ..................................................... 324/765.01

(58) Field of Classification Search
None
See application file for complete search history.

(56) References Cited

U.S. PATENT DOCUMENTS

| 5,488,281 A | 1/1996 | Unsworth et al. |
| 5,612,601 A | 3/1997 | Kueck et al. |

(Continued)

FOREIGN PATENT DOCUMENTS

| EP | 0 274 691 A1 | 7/1988 |
| EP | 1983644 A2 | 10/2008 |

(Continued)

OTHER PUBLICATIONS

International Search Report (PCT/ISA/210) issued on Mar. 5, 2010, by Swedish Patent Office as the International Searching Authority for International Application No. PCT/SE2009/051296.

(Continued)

*Primary Examiner* — Melissa Koval
*Assistant Examiner* — Courtney McDonnough
(74) *Attorney, Agent, or Firm* — Buchanan Ingersoll & Rooney P.C.

(57) ABSTRACT

A method and apparatus are provided for off-line testing of a multi-phase alternating current machine. The method comprises determining, at a first rotor position, a physical stator quantity of each stator winding by applying a test signal to each stator winding, and determining a first joint physical stator quantity by summing the determined physical stator quantities of the stator windings. There is also provided a method and apparatus for off-line testing of a multi-phase alternating current machine. The method comprises determining, at a second rotor position, a physical stator quantity of each stator winding by applying a test signal to each stator winding, determining a second joint physical stator quantity by summing the determined physical stator quantities of the stator windings, comparing the second joint physical stator quantity with a previously determined first joint physical stator quantity, and determining a fault condition of said multi-phase alternating current machine if the first joint physical stator quantity differs from the second joint physical stator quantity.

30 Claims, 4 Drawing Sheets

(56) References Cited

U.S. PATENT DOCUMENTS

| | | | |
|---|---|---|---|
| 5,623,190 A * | 4/1997 | Tajima et al. | 318/800 |
| 5,680,059 A | 10/1997 | Shiota et al. | |
| 6,005,364 A * | 12/1999 | Acarnley | 318/632 |
| 6,236,227 B1 | 5/2001 | Kliman et al. | |
| 6,393,373 B1 * | 5/2002 | Duyar et al. | 702/115 |
| 7,382,138 B1 | 6/2008 | Umans | |
| 7,483,796 B2 | 1/2009 | McLaughlin et al. | |
| 2001/0013792 A1 | 8/2001 | Kliman et al. | |
| 2008/0303543 A1 * | 12/2008 | Cop | 324/772 |
| 2009/0108783 A1 | 4/2009 | Paintz et al. | |

FOREIGN PATENT DOCUMENTS

| | | |
|---|---|---|
| JP | 2003-028938 A | 1/2003 |
| JP | 2003-274691 A | 9/2003 |
| WO | WO 2005/106514 A1 | 11/2005 |
| WO | WO 2005106514 A1 * | 11/2005 |
| WO | WO 2006/062589 A1 | 6/2006 |
| WO | WO 2008/153471 A1 | 12/2008 |

OTHER PUBLICATIONS

Written Opinion (PCT/ISA/237) issued on Mar. 5, 2010, by Swedish Patent Office as the International Searching Authority for International Application No. PCT/SE2009/051296.

Howard W. Penrose et al., Static Motor Circuit Analysis: An Introduction to Theory and Application, IEEE Electrical Insulation Magazine, Jul./Aug. 2000, pp. 6-10, vol. 16, No. 4.

David L. McKinnon, Using a Six Fault Approach for Predictive Maintenance on Motors, IEEE, 2007, pp. 253-264.

Stone et al., "*Electrical Testing of Low and Medium Voltage Motors,*" IEEE 48-54 (Aug. 2007).

Yang et al., "*An Advanced Stator Winding Insulation Quality Assessment Technique for Inventor-fed Machines,*" 3 IEEE 1562-1569 (Oct. 2006).

* cited by examiner

METHOD AND APPARATUS FOR OFF-LINE TESTING OF MULTI-PHASE ATERNATING CURRENT MACHINES

FIELD OF THE INVENTION

The present invention relates to testing of multi-phase alternating current machines. More specifically the present invention relates to a method and apparatus for off-line testing of multi-phase alternating current machines.

BACKGROUND ART

Electric motors have a wide field of application. In industrial production, for example, electric motors are used to drive pumps, conveyor belts, overhead cranes, fans, etc. An electric motor, adapted for use in a specific application, offers the user many advantages, mainly owing to its long life and limited need for maintenance. One basic requirement for a long electric motor life is that the rotor or stator in the electric motor does not have any faults or defects. Common types of rotor faults are, for example, breaks or cracks/fractures in a rotor bar, excessively high resistance in welded or soldered joints in the rotor, excessively large air cavities (as a result of the casting of the rotor) and rotor offset in air gaps relatively to the stator. Common types of stator faults are, for example, insulation faults between the turns of a winding, insulation faults between windings in the same phase, insulation faults between windings in different phases, insulation faults between windings and earth/motor casing, contaminated windings (i.e. impurities such as moisture, dust, or insulation charred due to overheating), an open turn of a winding in a delta-connected motor as well as contact problems between the winding ends and external connections.

When testing electric three-phase motors, it is common to measure current fundamental components during operation and to compare measurement data from the three phases. Usually, special sensors are used in these measurements to obtain measurement data.

It is known that it is possible to perform both on-line measurements and off-line measurements. Measuring methods carried out during operation (on-line measurements) are sensitive to disturbances in the power grid, i.e. fundamentals generated by other machines (for example switched power supply units, fluorescent tube fittings, etc.) that are connected to the same power grid. These disturbances cause erroneous measuring results and may even make measurements on the electric motor impossible.

When testing stators off-line according to the prior art, a powerful surge voltage with high energy content is supplied to the motor, following which the exponentially decaying response obtained is analyzed to identify possible faults in the stator. This measuring method has many disadvantages, such as it may initiate or accelerate/bring to completion incipient insulation failures; it requires time-consuming and complex calculations and analysis; it causes problems of pulse propagation in the winding due to L and C effects; it requires bulky and heavy equipment associated with transport/installation problems; and it is an expensive method.

WO 2005/106514 discloses a method for safe checking of electric motors. This method discloses measuring a physical quantity, such as current (I), inductance (L) or impedance (Z), of the stator winding while the rotor being rotated about an rotation axis. Thereby, periodic measuring data relating to the physical quantity is obtained, and measuring data relating to at least two periods of the periodic measuring data is collected. For the majority of all three-phase asynchronous motors, a sinusoidal relationship between the rotor position and the physical quantity (I, L or Z) is present, being symmetric about the X-axis in each phase. According to the method, the symmetry between at least the fundamentals of two or more half-cycles of the collected measuring data are compared. Asymmetry in the measuring data indicates a rotor and/or stator fault.

When performing the method disclosed in WO 2005/106514, the rotor has to be rotated in fixed steps of equal size or by continuous rotation at a constant rate. If the rotor is not rotated in fixed steps or at constant rate, asymmetry in the measuring data occurs. Normally, this asymmetry would indicate a rotor/stator fault, but could also be due to non-continuous rotation. Therefore, it is important that the rotor is being rotated in fixed steps or by continuous rotation for obtaining a reliable result. Since it may be difficult under some circumstances to obtain a perfect rotation of the rotor, either by continuous rotation or at fixed steps, especially when rotating the rotor by hand, this requirement may be hard to fulfill for the above described technique under these circumstances. Under some circumstances it may even be difficult or impossible to rotate the rotor at all during off-line testing.

SUMMARY OF THE INVENTION

Thus, it is an object of the present invention to provide an improvement of the above techniques and prior art.

A particular object is to provide a convenient, reliable and time efficient method for testing a multi-phase alternating current machine.

According to a first aspect there is provided a method for off-line testing of a multi-phase alternating current machine, which machine comprises at least two stator windings, and a rotor arranged along a rotation axis. The method comprises determining, at a first rotor position, a physical stator quantity of each stator winding by applying a test signal to each stator winding, and determining a first joint physical stator quantity by summing the determined physical stator quantities of the stator windings.

By the inventive method the machine may quickly and reliably be tested. The sum of the physical stator quantities, i.e. the first joint physical stator quantity, forms a machine specific parameter which may be used for indicating a change in the condition of the machine. The method hence relates to the characterization of the machine and the first joint physical stator quantity may be used as a reference value for that specific machine. Advantageously, the reference value may be used for detecting fault conditions in the machine as will be described in more detail below.

The method does not require any complex or time-consuming calculations since only the sum of the physical stator quantities needs to be determined.

By summing physical stator quantities of each phase, a first joint physical stator quantity which is independent of the rotor position may be determined. Furthermore, no rotation of the rotor needs to be performed during the testing even though rotation of the rotor is allowed during testing. This simplifies the testing and reduces the time required for testing the machine and also eliminates any problems of asymmetry in measurement data due to non-continuous rotation of the rotor.

The physical stator quantity of each stator winding comprises the impedance, Z. The impedance may comprise an inductance, L, and a resistance, R. The physical stator quantity may also comprise the ratio of an inductance, L, and a resistance, R, of a stator winding. The physical stator quantity may also comprise a phase angle Fi of a stator winding.

Throughout, the phase angle of a stator winding refers to the argument of the impedance of a stator winding, i.e. the phase difference between voltage and current.

For a symmetric alternating current machine, the rotor position influences the inductance L of each stator differently since the rotor position influences the coupling of the inductances L between the stator windings and rotor windings (if any). However, due to the symmetry of the machine the sum of the inductances L of the stator windings is independent of the rotor position. In general, the resistance R of the stator windings is not influenced by the rotor position. Also the sum of the stator winding impedances Z or phase angles Fi is independent of the rotor position.

According to one embodiment, the first joint physical stator quantity may be determined by weighting the physical stator quantities of each stator quantity and summing the weighted quantities so that the first joint physical stator quantity forms a mean value of the physical stator quantities of the stator windings.

According to one embodiment, the first rotor position is fixed during the determination of the physical stator quantities.

According to a second aspect, there is provided a method for off-line testing of a multi-phase alternating current machine, which machine comprises at least two stator windings, and a rotor arranged along a rotation axis. The method comprises determining, at a second rotor position, a physical stator quantity of each stator winding by applying a test signal to each stator winding, determining a second joint physical stator quantity by summing the determined physical stator quantities of the stator windings, comparing the second joint physical stator quantity with a previously determined first joint physical stator quantity, and determining a fault condition of said multi-phase alternating current machine if the first joint physical stator quantity differs from the second joint physical stator quantity.

By the inventive off-line test method a changed condition or fault condition in the machine may quickly and reliably be determined. The method does not require any complex or time-consuming calculations but a fault condition in the machine may simply be determined if the second joint physical stator quantity differs from the first joint physical stator quantity.

As discussed above, by summing physical stator quantities of each phase, a second joint physical stator quantity which is independent of the rotor position may be determined. Specifically, the rotor does not need to be rotated to the rotor position for which the first joint physical stator quantity was established. Furthermore, no rotation of the rotor needs to be performed during the testing even though rotation of the rotor is allowed during testing. This simplifies the testing and reduces the time required for testing the machine and also eliminates any problems of asymmetry in measurement data due to non-continuous rotation of the rotor.

The method may advantageously be used to in fault tracing. By the inventive test method, service personnel arriving at a location of the machine may quickly determine if it is in working order or not. In case a fault condition is determined, a more detailed analysis of the machine may be initiated. If the machine is found to be in working order, the personnel may move on to test other parts and components at the location.

The physical stator quantity of each stator winding may comprise the impedance, Z. The impedance may comprise an inductance, L, and a resistance, R. Alternatively, the physical stator quantity may comprise the ratio of an inductance, L, and a resistance, R, of a stator winding. The physical stator quantity may comprise a phase angle Fi of a stator winding.

In case a fault exists/arises in the machine, the above-discussed coupling of inductances L between the stator windings and rotor windings (if any) may change. Especially, all common types of faults in the rotor and the stator windings breaks the symmetry of the machine. As a result, the sum of the inductances L, impedances Z or phase angles Fi will change and no longer be independent of the rotor position. Consequently, the second joint physical stator quantity will no longer be equal to the first joint physical stator quantity.

Also the resistance R of the stator windings may change over time. For example, the resistance R of the stator windings may change due to degradation such as charring or oxidation on connection terminals of the machine, shorts in or between the windings, insulation faults etc.

Thus, a first and second joint physical stator quantity determined as the sum of the inductances L, impedances Z or phase angles Fi may be used to determine faults such as symmetry faults in the machine. A first and second joint physical stator quantity determined as the sum of the resistances R may be used to determine faults such as stator winding degradation. A first and second joint physical stator quantity determined as the sum of the impedances Z, the phase angles Fi, the inductances L or the ratios of the inductance L and the resistance R may be used to determine any of the above faults.

According to one embodiment, the first joint physical stator quantity may be determined by weighting the physical stator quantities of each stator quantity and summing the weighted quantities so that the first joint physical stator quantity forms a mean value of the physical stator quantities of the stator windings.

According to one embodiment, the first joint physical stator quantity corresponds to a joint physical stator quantity established for the multi-phase alternating current machine in a functioning state. In this description, a machine in a functioning state refers to a machine which is known to be fault-free, i.e. free from defects. This knowledge may have been gained from earlier elaborate testing of the machine, optical inspection etc. for instance during production and assembly of the machine, i.e. at a time when thorough testing of the machine was feasible. This embodiment provides the advantage that the first joint physical stator quantity is known to be a reliable reference. As discussed earlier, for a machine in a functioning state the first joint physical stator quantity may be independent of the rotor position.

According to one embodiment, the second rotor position is fixed during the determination of the physical stator quantities.

According to one embodiment, the fault condition is determined if the first joint physical stator quantity differs from the second joint physical stator quantity by more than a threshold value.

According to one embodiment, the first joint physical stator quantity is determined for a first rotor position, different from the second rotor position. Or to put it differently, the rotor does not need to be rotated to the rotor position for which the first joint physical stator quantity was established in order for the testing to work. This is due to the rotor position independence of the first and second joint physical stator quantities.

According to a third aspect, there is provided an apparatus for off-line testing of a multi-phase alternating current machine, which machine comprises at least two stator windings, and a rotor arranged along a rotation axis. The apparatus comprises electronic circuitry arranged to determine, at a first rotor position, a physical stator quantity of each stator winding by applying a test signal to each stator winding, and electronic circuitry arranged to determine a first joint physical stator quantity by summing the determined physical stator quantities of the stator windings.

According to a fourth aspect, there is provided an apparatus for off-line testing of a multi-phase alternating current machine, which machine comprises at least two stator windings, and a rotor arranged along a rotation axis. The apparatus comprises electronic circuitry arranged to determine, at a second rotor position, a physical stator quantity of each stator winding by applying a test signal to each stator winding, electronic circuitry arranged to determine a second joint physical stator quantity by summing the determined physical stator quantities of the stator windings, electronic circuitry arranged to compare the second joint physical stator quantity with a previously determined first joint physical stator quantity, and electronic circuitry arranged to determine a fault condition of said multi-phase alternating current machine if the first joint physical stator quantity differs from the second joint physical stator quantity.

The details and advantages discussed in relation to the first and second aspect applies correspondingly to the third and fourth aspect whereby reference is being made to the above discussion.

According to a fifth aspect, there is provided a method for off-line testing of a multi-phase alternating current machine, which machine comprises at least two stator windings, and a rotor arranged along a rotation axis, which method comprises: determining, at a first rotor position, a physical stator quantity of each stator winding by applying a test signal to each stator winding, determining a first joint physical stator quantity by summing the physical stator quantities of the stator windings determined at the first rotor position, determining, at a second rotor position, a physical stator quantity of each stator winding by applying a test signal to each stator winding, determining a second joint physical stator quantity by summing the physical stator quantities of the stator windings determined at the second rotor position, and determining a joint physical stator quantity trend based on the first joint physical stator quantity and the second joint physical stator quantity.

According to one embodiment, the first rotor position and the second rotor position may be different.

According to the invention, the physical stator quantity of each stator winding may comprise any or a group of: an impedance, Z, an inductance, L, a phase angle, Fi, a resistance, R, and a ratio of an inductance, L, and a resistance, R, of each stator winding.

According to one embodiment, the method further comprises, based on the trend, estimating a third joint physical stator quantity.

According to one embodiment, the method further comprises predicting a fault condition of the multi-phase alternating current machine if the third joint physical stator quantity falls outside a predetermined range.

According to one embodiment, the method further comprises, based on the trend, predicting a point in time at which a third joint physical stator quantity reaches a predetermined value.

According to one embodiment, the method further comprises determining a fault condition of the multi-phase alternating current machine if the trend deviates from a predetermined trend. Especially, the predetermined trend may correspond to a constant joint physical stator quantity.

According to a sixth aspect, there is provided an apparatus for off-line testing of a multi-phase alternating current machine, which machine comprises at least two stator windings, and a rotor arranged along a rotation axis, which apparatus comprises: electronic circuitry arranged to determine, at a first rotor position, a physical stator quantity of each stator winding by applying a test signal to each stator winding, electronic circuitry arranged to determine a first joint physical stator quantity by summing the physical stator quantities of the stator windings determined at the first rotor position, electronic circuitry arranged to determine, at a second rotor position, a physical stator quantity of each stator winding by applying a test signal to each stator winding, electronic circuitry arranged to determine a second joint physical stator quantity by summing the physical stator quantities of the stator windings determined at the second rotor position, and electronic circuitry arranged to determine a joint physical stator quantity trend based on the first joint physical stator quantity and the second joint physical stator quantity.

The details discussed in relation to the fifth aspect applies correspondingly to the sixth aspect whereby reference is being made to the above discussion.

BRIEF DESCRIPTION OF THE DRAWINGS

The present invention will be further described hereinafter with reference to the accompanying drawings, which show an embodiment of the invention as a non-limiting example.

DETAILED DESCRIPTION OF PREFERRED EMBODIMENT(S)

Figure 1:
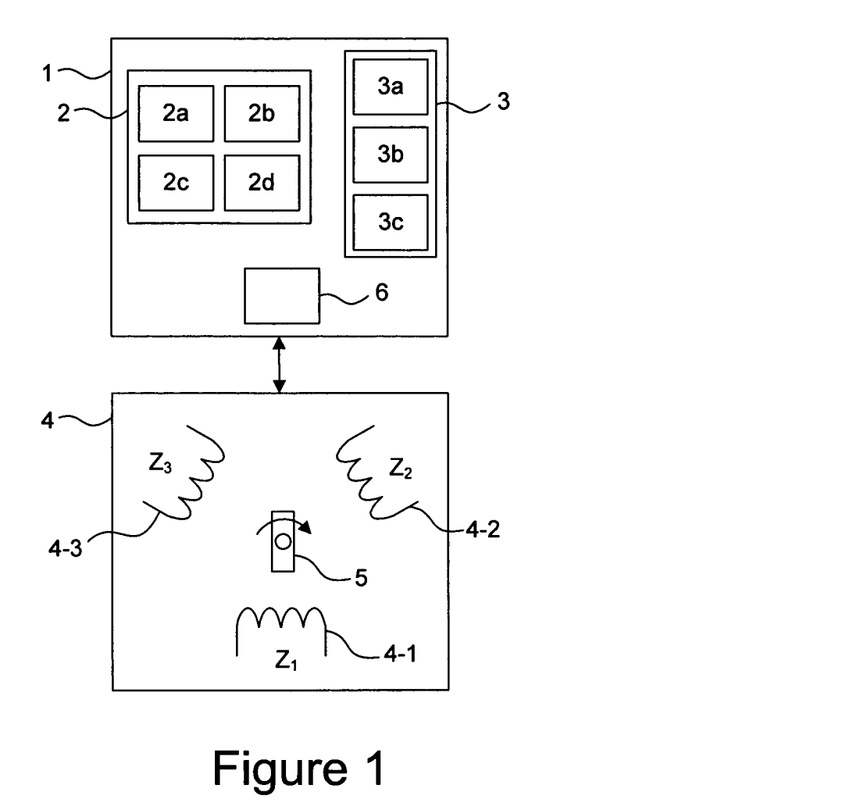
FIG. 1 is a block diagram of a preferred embodiment of a measuring device according to the present invention.

A system in which the present invention may be applied will first be described with reference to FIG. 1.

Referring to the block diagram in FIG. 1, a preferred embodiment of a measuring device 1 according to the present invention will be described. The measuring device 1 comprises a control unit 2, which preferably comprises: a CPU 2a, a program memory 2b, a data memory 2c, and an A/D converter 2d. The measuring device further comprises a measuring circuit 6. The measuring device 1 may additionally comprise a screen, which is connected to the control unit 2.

The measuring device 1 comprises a waveform generator 3 connected to the control unit 2, which preferably comprises: a D/A converter 3a, a reconstruction filter 3b and a power amplifier 3c.

The measuring device 1 comprises inputs for connection to a test object 4.

The test object 4 is a multi-phase alternating current machine. The machine may be a two-phase machine, a three-phase machine, a six-phase or any other multi-phase machine. The machine may be an induction or asynchronous machine, single or doubly fed synchronous machine, permanent magnet rotor machine or any other type of machine suitable for testing according to the present invention. The machine may be a motor or a generator. In FIG. 1, the test object 4 is a three-phase alternating current machine. The test object 4 comprises three stator windings 4-1, 4-2, 4-3 and a rotor 5 arranged along a rotation axis. The present invention is applicable to both y- and delta-connected three-phase machines.

The control unit 2 monitors and controls the waveform generator 3 and the measuring circuit 6 in accordance with program instructions stored in the program memory 2b, and records and calculates output data according to given program instructions, the result may be illustrated on a screen. More specifically, the control unit 2 may control the waveform generator 3 to generate a sinusoidal test signal, whose frequency is preferably in the range of 25-800 Hz for determining the physical stator quantities of the test object 4. One advantage with the inventive test method is that since no rotation of the rotor needs to be carried out, i.e. the test is an off-line test, the voltage of the test signal may be much smaller than the operating voltage of the test object 4, thereby reducing the power requirements of the measuring device 1. Specifically, the measuring device 1 may be realized as a portable, battery powered device. The signal voltage may for example be e.g. 1 V rms. The control unit 2 may also control the waveform generator 3 to generate a DC signal for determining the resistance of the stator windings of the test object 4.

The measuring device 1 may determine the current (I) through the test object 4, the impedance (Z), inductance (L), phase angle (Fi) and/or resistance (R) of the stator windings 4-1, 4-2, 4-3 in manners well-known in the art. For example, the measuring circuit 6 may comprise a measuring resistor being connected in series to the stator windings 4-1, 4-2, 4-3. The test signal is applied and the voltage amplitude and phase caused across the measuring resistor, corresponding to the current flowing through the test object, is determined by the control unit 2. The measuring circuit 6 may further comprise detectors for determining the voltage amplitude and phase across the test object 4. Especially, the phase angle Fi, may be determined as the difference between the phase of the applied voltage and the phase of the current through the measuring resistor of the measuring circuit 6. By applying both a DC signal and a sinusoidal signal, the impedance Z (i.e. both the resistance R and the inductance L) of stator windings 4-1, 4-2, 4-3 the test object 4 may be determined. The program instructions required by the control unit 2 to determine the quantities are stored in the program memory 2b.

Figure 2:
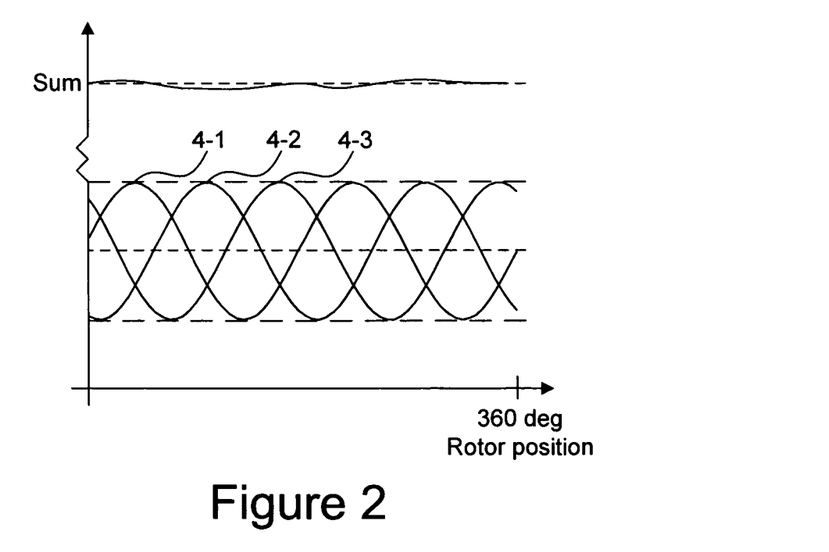
FIG. 2 schematically illustrates stator quantities and the sum thereof for a three-phase alternating current machine as a function of rotor position.

In a test according to the present invention, the rotor position, i.e. the rotational angle of the rotor 5 about its rotational axis, influences the impedance (Z), the phase angle (Fi) and the inductance (L) in the stator windings 4-1, 4-2, 4-3. Since the relative rotor position differs for each phase the rotor 5 influences each stator winding 4-1, 4-2, 4-3 differently. This results in different effective physical stator quantities for different rotor positions. In FIG. 2, the effective inductances L, phase angles Fi, or impedances Z for each phase 4-1, 4-2, 4-3 of a fault-free test object 4 are illustrated as a function of the rotor position. As can be readily seen in FIG. 2, the sinusoidal waveforms for the phases are substantially identical but phase displaced by 120° with respect to each other. This is due to the symmetrical arrangement of the stator windings 4-1, 4-2, 4-3 with respect to the rotational axis of the rotor 5. In general, the phase displacement depends on the number of phases. The inventive method is equally applicable even if the waveforms exhibit other shapes than sinusoidal depending e.g. on the arrangement of the stator windings and the rotor.

Due to the symmetrical arrangement of the stator windings 4-1, 4-2, 4-3, the sum of the impedance, phase angle or inductance values at a first rotor position equals the sum of the impedance, phase angle or inductance values at any other rotor position, as illustrated in FIG. 2. Thus, a rotor position independent joint physical stator quantity may be determined as the sum of the impedance, the phase angle or inductance values.

In practice the sum may be slightly influenced by the rotor position, as illustrated in FIG. 2, due to inaccuracies during assembly of the motor, measurement inaccuracies, slight differences between the stator windings etc. However, the variation of the sum will in general be very small (less than 1%) for a fault-free test object 4.

To compensate for this small variation, a reference value may optionally be determined as a mean value of any number of reference values as defined above and being determined for a plurality of rotor positions. This may increase the reliability and accuracy of the reference value.

Thus, according to the present invention a first joint physical stator quantity value (or shorter "reference value") may be determined for a fault-free test object 4. The reference values are assumed to be determined at time t=0. Any or a combination of: the resistance (R), inductance (L), phase angle (Fi) or impedance (Z) values may be determined for each stator winding. Any or a combination of the following reference values may then be determined according to the following:

$$L_{ref} = L_1(t=0) + L_2(t=0) + L_3(t=0)$$

$$R_{ref} = R_1(t=0) + R_2(t=0) + R_3(t=0)$$

$$Z_{ref} = Z_1(t=0) + Z_2(t=0) + Z_3(t=0)$$

$$(L/R)_{ref} = (L/R)_1(t=0) + (L/R)_2(t=0) + (L/R)_3(t=0)$$

$$(R/L)_{ref} = (R/L)_1(t=0) + (R/L)_2(t=0) + (R/L)_3(t=0)$$

$$Fi_{ref} = Fi_1(t=0) + Fi_2(t=0) + Fi_3(t=0)$$

where the subscripts 1, 2, 3 denote the stator winding which the value is determined for. It is emphasized that the inductance values $L_{1-3}$ should be determined for a common first rotor position since they are influenced by the rotor position. This is also true for the impedance values $Z_{1-3}$ and phase angles $Fi_{1-3}$. However, this is not essential for the resistance values since they in general not are influenced by the rotor position. Furthermore, if determining more than one reference values it is not essential to determine them for the same rotor position.

By determining the sum of the impedance of each stator winding 4-1, 4-2, 4-3 changes in both resistance and inductance may be determined simultaneously. This is also true for the sum of the phase angles since the phase angle of each stator winding is dependent on both the resistance and the inductance.

The magnitude of the reference values are dependent on the specifics of the test object 4. Thus, the reference values are unique and characteristic for each test object 4.

Any of the reference values may later be used to conveniently determine if the condition of the test object 4 has deteriorated at a later time t=T>0. By determining any or a combination of the resistance (R), inductance (L), phase angle (Fi) or impedance (Z) for each stator winding of the test object 4 at a second rotor position a second joint physical stator quantity (or shorter "test value") may be determined. The second rotor position may be any rotor position, i.e. it may be the same as the first rotor position for which the reference values were established, or it may be different from the first rotor position. Any or a combination of the following test values may then be determined according to the following:

$$L_{test}=L_1(t=T)+L_2(t=T)+L_3(t=T)$$

$$R_{test}=R_1(t=T)+R_2(t=T)+R_3(t=T)$$

$$Z_{test}=Z_1(t=T)+Z_2(t=T)+Z_3(t=T)$$

$$(L/R)_{test}=(L/R)_1(t=T)+(L/R)_2(t=T)+(L/R)_3(t=T)$$

$$(R/L)_{test}=(R/L)_1(t=T)+(R/L)_2(t=T)+(R/L)_3(t=T)$$

$$Fi_{test}=Fi_1(t=T)+Fi_2(t=T)+Fi_3(t=T)$$

where the subscripts 1, 2, 3 denote the stator winding which the value is determined for. It is emphasized that the inductance values $L_{1-3}$ should be determined for a common second rotor position since they are influenced by the rotor position. This is also true for the impedance values $Z_{1-3}$ and phase angles $Fi_{1-3}$. However, this is not essential for the resistance values since they in general not are influenced by the rotor position.

If the corresponding previously determined reference value of the test object, established at the first rotor position, differs from the test value, established at the second rotor position (e.g. if $Z_{test}$ differs from $Z_{ref}$), this is indicative of a fault condition in the test object.

Although in the above, the reference and test values were determined as sums of the stator quantities the reference and test values may alternatively be determined as mean values of the corresponding stator quantities. For example, an impedance reference value and corresponding impedance test value may be determined as:

$$Z_{ref}=(1/3)Z_1(t=0)+(1/3)Z_2(t=0)+(1/3)Z_3(t=0)$$

$$Z_{test}=(1/3)Z_1(t=T)+(1/3)Z_2(t=T)+(1/3)Z_3(t=T)$$

The expression t=0 and t=T in the above equations should not be interpreted narrowly such that the physical stator quantities need to be determined simultaneously. Depending on the testing conditions and specifics of the measuring device, the physical stator quantities may be determined simultaneously or individually and sequentially (i.e. some time passing between each determination of physical stator quantity of a stator winding). However, the physical stator quantities for all stator windings should be determined for a common rotor position, i.e. for the same rotor position.

The physical stator quantities may be determined while the rotor is fixed, i.e. not rotating. The physical stator quantities may also be determined while the rotor is rotating. In that case, the physical stator quantities of all stator windings may be determined simultaneously at an instant rotor position. Alternatively, by using an angle sensor the physical stator quantities may be determined sequentially by determining a physical stator quantity of a first stator winding at an instant rotor position, waiting until the rotor has made a full revolution, and then determining a physical stator quantity of a second stator winding. This procedure may be repeated until the physical stator quantities of all stator windings have been determined.

Figure 3:
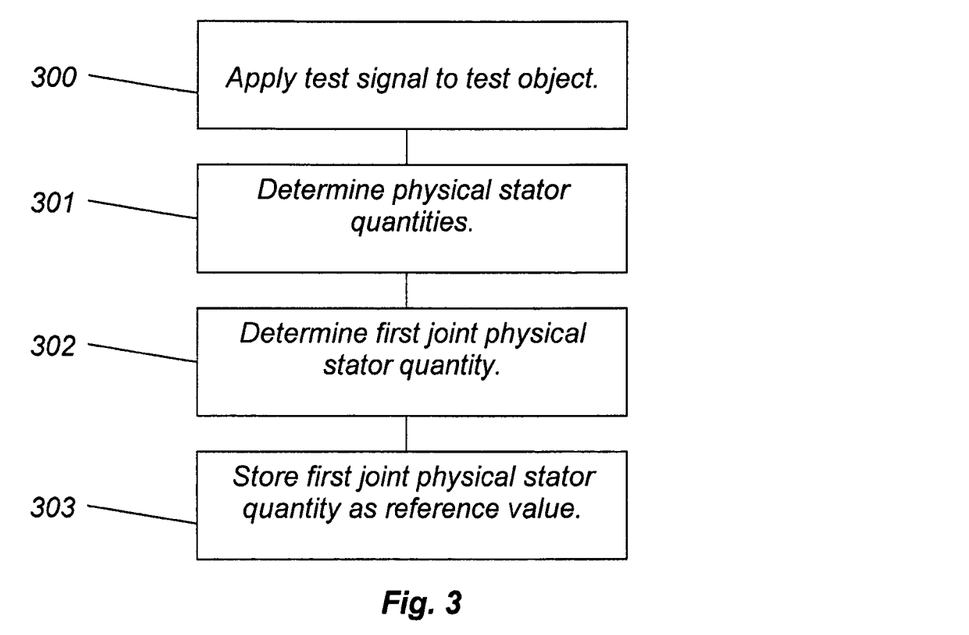
FIG. 3 is a flow chart of a method for off-line testing of an electric motor according to the present invention.

Referring to the flow chart in FIG. 3, a test method according to a first aspect of the present invention will be described. Preferably, the test object is known to be fault-free.

In step 300, the waveform generator 3 is started, thereby generating a periodical test signal, in the range of 25-800 Hz and 1 V rms, which is applied to the test object 4. Preferably, both a periodical test signal and a DC signal are generated and in turn applied to the test object 4. However, it is equally possible to apply a first and second test signal which both have a frequency being different from zero (i.e. non-DC), or to apply a single AC test signal.

In step 301, the physical stator quantity for each stator winding of the test object 4 is determined at a first rotor position. More specifically, the physical stator quantities may be determined while the rotor is fixed, i.e. not rotating. The physical stator quantities may also be determined while the rotor is rotating as been previously described. In that case, the physical stator quantities of all stator windings may be determined simultaneously at an instant rotor position, i.e. all inductance values $L_{1-3}$, phase angles $Fi_{1-3}$ and/or all impedance values $Z_{1-3}$ are determined at the same rotor position.

In step 302, the reference value, i.e. the first joint physical stator quantity, is determined by summing the determined physical stator quantities as described above.

In step 303, the reference value is stored for later use. The reference value may be stored in the data memory 2c of the measuring device 1, stored in a database in a server for later retrieval over a network such as the internet. Alternatively, or in addition thereto, the reference value may be printed on a data sheet or on the test object 4 allowing for quick and convenient access.

The instructions required by the control unit 2 for performing the above-described method may be stored as computer instructions in the program memory 2b.

Figure 4:
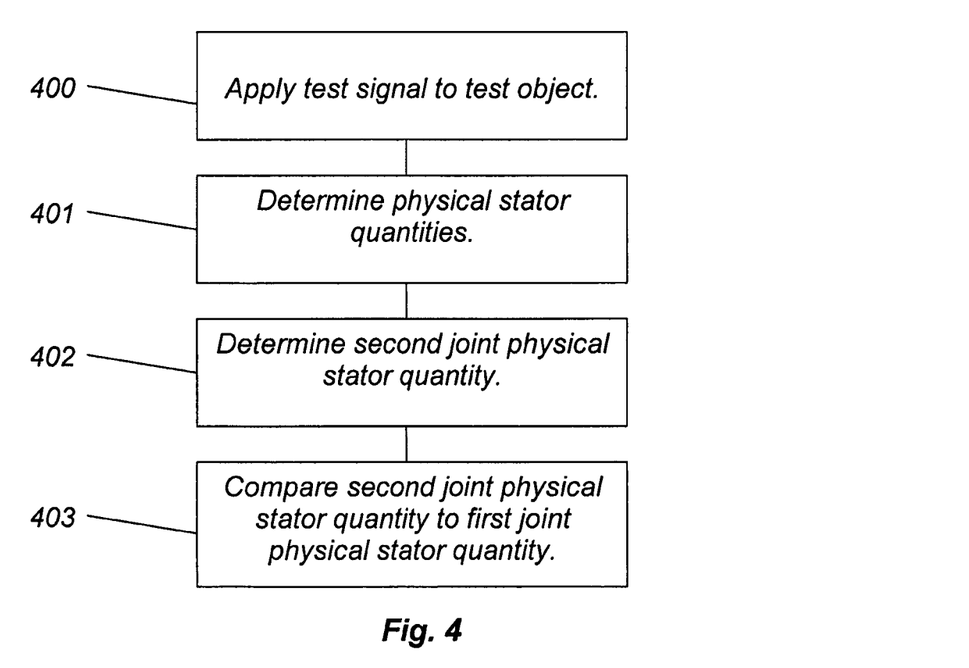
FIG. 4 is a flow chart of a method for off-line testing of an electric motor according to the present invention.

Referring to the flow chart in FIG. 4, a test method according to a second aspect of the present invention will be described wherein a test object whose condition is unknown may be determined.

In step 400, the waveform generator 3 is started, thereby generating a periodical test signal, preferably in the range of 25-800 Hz and 1 V rms, which is applied to the test object 4. Preferably, both a periodical test signal and a DC signal are generated and in turn applied to the test object 4. However, it is equally possible to apply a first and second test signal which both have a frequency being different from zero (i.e. non-DC), or to apply a single AC test signal.

In step 401, the physical stator quantities are determined for each stator winding of the test object 4 at a second rotor position. More specifically, the physical stator quantities may be determined while the rotor is fixed, i.e. not rotating. The physical stator quantities may also be determined while the rotor is rotating as been previously described. In that case, the physical stator quantities of all stator windings may be determined simultaneously at an instant rotor position, i.e. all inductance values $L_{1-3}$, phase angles $Fi_{1-3}$ and/or all impedance values $Z_{1-3}$ are determined at the same position.

In step 402, the test value, i.e. the second joint physical stator quantity, is determined by summing the determined physical stator quantities as described above.

In step 403, the test value is compared to a previously determined first joint physical stator quantity, i.e. a reference.

If the test value differs from the corresponding reference value, a fault condition of the test object 4 is determined. In that case, the control unit 2 generates a signal. The signal may be transmitted to the screen, and transformed to a visual representation. Alternatively, the signal may be transformed in any other way in order to be communicated to a person, or computer, performing and/or monitoring the testing. Alternatively, the test value may be communicated to a person through the screen and the person may manually determine a fault condition in the test object by comparing the test value to the reference value. As been previously described, the reference value may be stored in the data memory 2c or in server on a network, or printed on a data sheet or on the test object 4.

The instructions required by the control unit 2 for performing the above-described method may be stored as computer instructions in the program memory 2b.

Preferably, the first joint physical stator quantity is a previously determined joint physical stator quantity determined as a sum of the same physical stator quantities as the second joint physical stator quantity and for the same test object 4. The first joint physical stator quantity may have been determined for a first rotor position, different from or equal to the second rotor position.

In order to increase the reliability of the testing, a fault condition may be determined if the test value differs from the corresponding reference value by more than a threshold value. This reduces erroneous fault determinations due to measurement inaccuracies, measurement errors, or the slight influence of rotor position on the inductance or impedance sums as described above.

Alternatively, or in addition to the above described test methods, measurement data in the form of a plurality of test values may be determined at several rotor positions and/or at several times different times. As an example, the test values may be determined at regular test intervals in time. The trend in the measurement data over time may then be determined. This may be useful during diagnosis of a test object in order to evaluate when or why a fault of the test object appeared. This may also be useful in predictive maintenance applications in order to help predict and/or detect faults before they arise. If the measurement data presents an increasing or decreasing trend over a sufficient time interval (e.g. at least two subsequent test occasions) a fault of the test object may be predicted. The measuring device may, upon determining such a trend, predict a fault condition of the test object.

According to this embodiment, it is not necessary to determine a reference value, i.e. the predictive test method may be used in combination with the above described test methods or as a separate test method.

Figure 5:
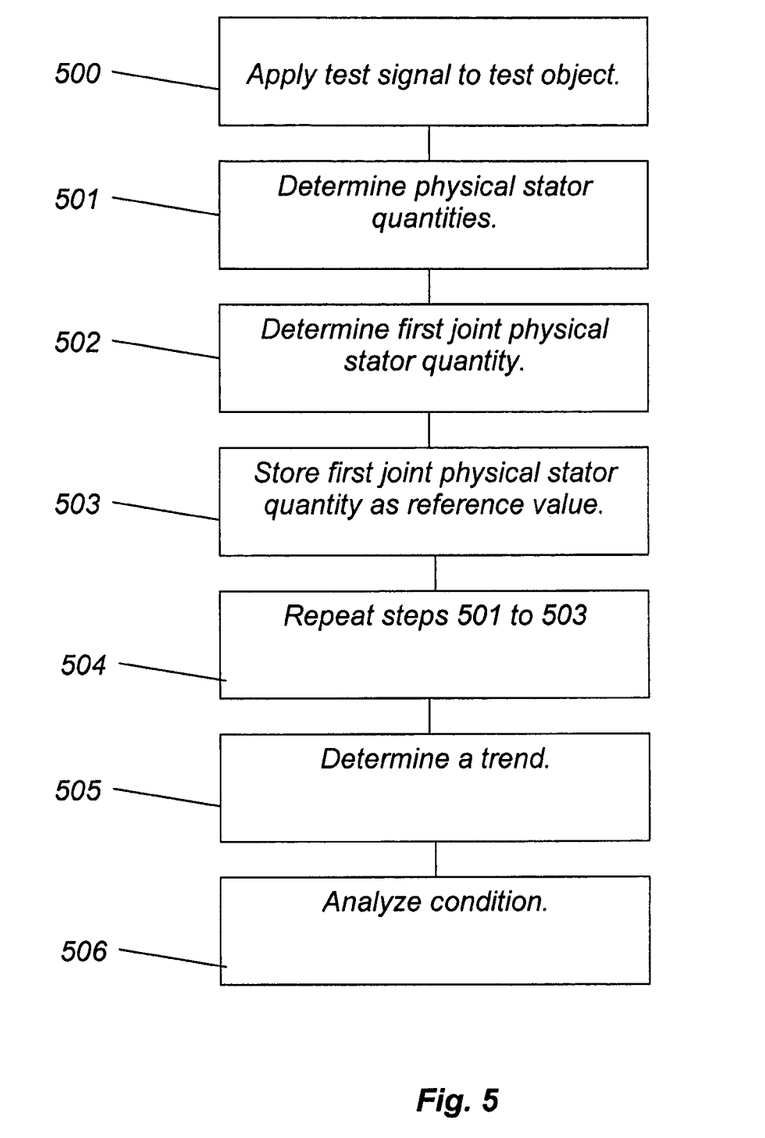
FIG. 5 is a flow chart of a method for off-line testing of an electric motor according to the present invention.

Referring to the flow chart in FIG. 5, a method for testing a test object 4 according to a further aspect of the present invention will be described. Preferably, the test object 4 is known to be fault-free.

In step 500, the waveform generator 3 is started, thereby generating a periodical test signal, in the range of 25-800 Hz and 1 V rms, which is applied to the test object 4. Preferably, both a periodical test signal and a DC signal are generated and in turn applied to the test object 4. However, it is equally possible to apply a first and second test signal which both have a frequency being different from zero (i.e. non-DC), or to apply a single AC test signal.

In step 501, the physical stator quantity for each stator winding of the test object 4 is determined at a first rotor position. More specifically, the physical stator quantities may be determined while the rotor is fixed, i.e. not rotating. The physical stator quantities may also be determined while the rotor is rotating as been previously described. In that case, the physical stator quantities of all stator windings may be determined simultaneously at an instant rotor position, i.e. all inductance values $L_{1-3}$, phase angles $Fi_{1-3}$ and/or all impedance values $Z_{1-3}$ are determined at the same rotor position.

In step 502, a first test value, i.e. a first joint physical stator quantity, is determined by summing the determined physical stator quantities as described above.

In step 503, the first test value is stored for later use. The first test value may be stored in the data memory 2c of the measuring device 1, or stored in a database in a server for later retrieval over a network such as the internet.

In step 504, steps 501 to 503 are repeated whereby a second test value, e.g. a second joint physical stator quantity for a second rotor position, is determined and stored. The first and the second test values relate to the same physical quantities. Preferably, step 504 is performed at a subsequent test and/or service occasion separated by some interval of time from the first occasion.

In step 505, a joint physical stator quantity trend is determined based on the first and the second test values. Although, in this exemplary embodiment, the trend is based on the first and second test values, preferably, the trend may be based on a plurality of test values determined at several different test and/or service occasions. This may yield a more accurate trend determination. The trend may be determined by interpolating between the test values.

Figure 6A:
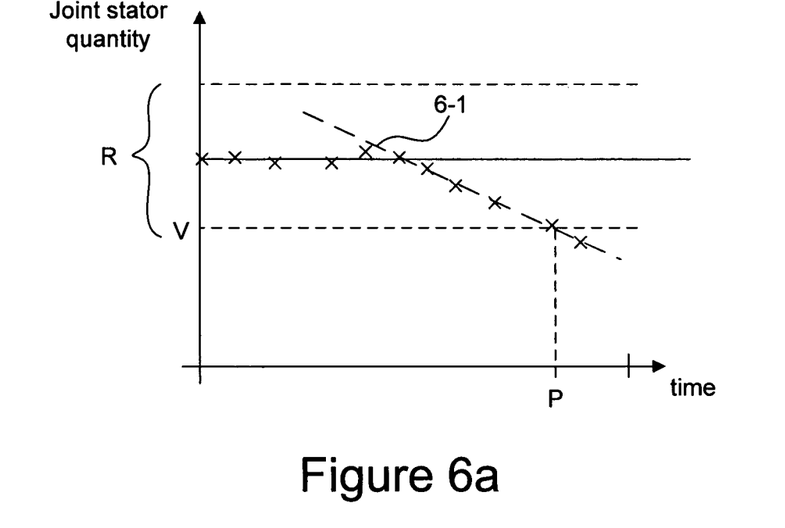
FIG. 6 schematically illustrates trending based on joint physical stator quantities.

FIG. 6 illustrates an exemplary test result comprising a plurality of test values, X, as well as trend curves. As indicated, the trend may be linear (trend curve 6-1) or polynomial of any order (trend curve 6-3). Other curve fitting techniques, such as exponential or logarithmical are equally possible.

In step 506, the condition of the test object 4 is analyzed based on the joint physical stator quantity trend as will be disclosed in detail below.

Optionally, the measuring device 1 may estimate a third joint physical stator quantity, based on the test values. The estimate may be determined by extrapolation based on the test values. The third joint physical stator quantity thus forms a prediction of the future condition of the test object 4. Especially, a fault condition of the test object 4 may be predicted if the third joint physical stator quantity falls outside a predetermined range (range R in FIG. 6a). Alternatively, a point in time (time P in FIG. 6a) at which an estimated third joint physical stator quantity reaches a predetermined value (value V in FIG. 6a) may be predicted based on the trend. Different magnitudes of the predetermined values may be used for predicting different severities of the condition of the test object 4. E.g. depending on the choice of the predetermined value, the point in time may indicate a predicted time for a fatal failure of the test object 4 or a predicted time for a less severe fault condition in the test object 4.

Figure 6B:
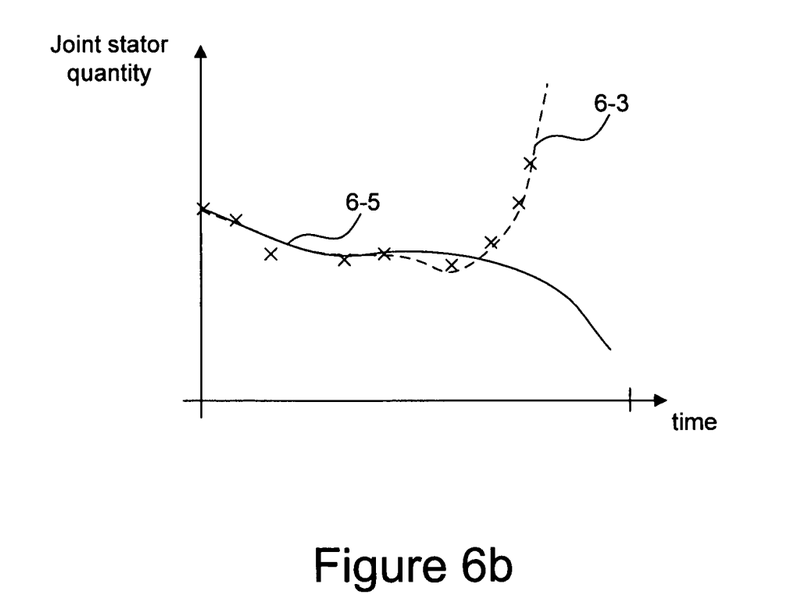

Optionally, a fault condition of the test object 4 may be determined if the trend based on the test values (trend curve 6-3 in FIG. 6b) deviates from a predetermined trend (predetermined trend curve 6-5 in FIG. 6b). The reliability of the testing may be increased by allowing for some difference between the trend and the predetermined trend without determining a fault condition. The predetermined trend may be a positive trend in the joint physical stator quantities or a negative trend in the joint physical stator quantities. Alternatively, the predetermined trend may correspond to a constant joint physical stator quantity. More generally, the predetermined trend may be based on a plurality of test values, determined during the entire life span of a plurality of test objects, and may thus comprise intervals of both positive trend, negative trend and intervals corresponding to constant joint physical stator quantities (as in predetermined trend curve 6-5 in FIG. 6b).

The instructions required by the control unit 2 for performing the above-described method may be stored as computer instructions in the program memory 2b.

It is contemplated that there are numerous modifications of the embodiments described herein, which are still within the scope of the invention as defined by the appended claims.

The invention claimed is:

1. A method for off-line testing of a multi-phase alternating current machine, which machine comprises at least two stator windings, and a rotor arranged along a rotation axis, which method comprises:

determining, at a first rotor position, a physical stator quantity of each stator winding by applying a test signal to each stator winding, determining a first joint physical stator quantity by summing the physical stator quantities of the stator windings determined at the first rotor position, subsequently determining, at a second rotor position, a physical stator quantity of each stator winding by applying a test signal to each stator winding, determining a second joint physical stator quantity by summing the physical stator quantities of the stator windings determined at the second rotor position, comparing the second joint physical stator quantity with the previously determined first joint physical stator quantity, and determining a fault condition of said multi-phase alternating current machine if the first joint physical stator quantity differs from the second joint physical stator quantity.

2. The method as claimed in claim 1, wherein the physical stator quantity of each stator winding comprises any or a group of: an impedance, Z, an inductance, L, a phase angle, Fi, a resistance, R, and a ratio of an inductance, L, and a resistance, R, of each stator winding.

3. The method as claimed in claim 1, wherein the summing further comprises weighting the physical stator quantities so that the second joint stator quantity forms a mean value of the physical stator quantities of the stator windings determined at a plurality of rotor positions.

4. The method as claimed in claim 1, wherein the first joint physical stator quantity corresponds to a joint physical stator quantity established for the multi-phase alternating current machine in a functioning state.

5. The method as claimed in claim 1, wherein the second rotor position is fixed during the determination of the physical stator quantities.

6. The method as claimed in claim 1, wherein the fault condition is determined if the first joint physical stator quantity differs from the second joint physical stator quantity by more than a threshold value.

7. The method as claimed in claim 1, wherein the first joint physical stator quantity is determined for a first rotor position, different from the second rotor position.

8. An apparatus for off-line testing of a multi-phase alternating current machine, which machine comprises at least two stator windings, and a rotor arranged along a rotation axis, which apparatus comprises:

electronic circuitry arranged to determine, at a first rotor position, a physical stator quantity of each stator winding by applying a test signal to each stator winding, electronic circuitry arranged to determine a first joint physical stator quantity by summing the physical stator quantities of the stator windings determined at the first rotor position, electronic circuitry arranged to subsequently determine, at a second rotor position, a physical stator quantity of each stator winding by applying a test signal to each stator winding, electronic circuitry arranged to determine a second joint physical stator quantity by summing the physical stator quantities of the stator windings determined at the second rotor position, electronic circuitry arranged to compare the second joint physical stator quantity with a previously determined first joint physical stator quantity, and electronic circuitry arranged to determine a fault condition of said multi-phase alternating current machine if the first joint physical stator quantity differs from the second joint physical stator quantity.

9. The apparatus as claimed in claim 8, wherein the physical stator quantity of each stator winding comprises any or a group of: an impedance, Z, an inductance, L, a phase angle, Fi, a resistance, R, and a ratio of an inductance, L, and a resistance, R, of each stator winding.

10. The apparatus as claimed in claim 8, wherein the summing further comprises weighting the physical stator quantities so that the second joint stator quantity forms a mean value of the physical stator quantities of the stator windings determined at a plurality of rotor positions.

11. The apparatus as claimed in claim 8, wherein the first joint physical stator quantity corresponds to a joint physical stator quantity established for the multi-phase alternating current machine in a functioning state.

12. The apparatus as claimed in claim 8, wherein the second rotor position is fixed during the determination of the physical stator quantities.

13. The apparatus as claimed in claim 8, wherein the fault condition is determined if the first joint physical stator quantity differs from the second joint physical stator quantity by more than a threshold value.

14. The apparatus as claimed in claim 8, wherein the first joint physical stator quantity is determined for a first rotor position, different from the second rotor position.

15. A method for off-line testing of a multi-phase alternating current machine, which machine comprises at least two stator windings, and a rotor arranged along a rotation axis, which method comprises:

determining, at a first rotor position, a physical stator quantity of each stator winding by applying a test signal to each stator winding, determining a first joint physical stator quantity by summing the physical stator quantities of the stator windings determined at the first rotor position, subsequently determining, at a second rotor position, a physical stator quantity of each stator winding by applying a test signal to each stator winding, determining a second joint physical stator quantity by summing the physical stator quantities of the stator windings determined at the second rotor position, and determining a joint physical stator quantity trend based on the first joint physical stator quantity and the second joint physical stator quantity.

16. The method as claimed in claim 15, further comprising, based on said trend, estimating a third joint physical stator quantity.

17. The method as claimed in claim 16, further comprising predicting a fault condition of said multi-phase alternating current machine if the third joint physical stator quantity falls outside a predetermined range.

18. The method as claimed in claim 15, further comprising, based on said trend, predicting a point in time at which a third joint physical stator quantity reaches a predetermined value.

19. The method as claimed in claim 15, further comprising determining a fault condition of said multi-phase alternating current machine if said trend deviates from a predetermined trend.

20. The method as claimed in claim 19, wherein the predetermined trend corresponds to a constant joint physical stator quantity.

21. The method as claimed in claim 15, wherein the first rotor position and second rotor position are different.

22. The method as claimed in claim 15, wherein the physical stator quantity of each stator winding comprises any or a group of: an impedance, Z, an inductance, L, a phase angle, Fi, a resistance, R, and a ratio of an inductance, L, and a resistance, R, of each stator winding.

23. An apparatus for off-line testing of a multi-phase alternating current machine, which machine comprises at least two stator windings, and a rotor arranged along a rotation axis, which apparatus comprises:

electronic circuitry arranged to determine, at a first rotor position, a physical stator quantity of each stator winding by applying a test signal to each stator winding, electronic circuitry arranged to determine a first joint physical stator quantity by summing the physical stator quantities of the stator windings determined at the first rotor position, electronic circuitry arranged to subsequently determine, at a second rotor position, a physical stator quantity of each stator winding by applying a test signal to each stator winding, electronic circuitry arranged to determine a second joint physical stator quantity by summing the physical stator quantities of the stator windings determined at the second rotor position, and electronic circuitry arranged to determine a joint physical stator quantity trend based on the first joint physical stator quantity and the second joint physical stator quantity.

24. The apparatus as claimed in claim 23, further comprising electronic circuitry adapted to estimate a third joint physical stator quantity based on said trend.

25. The apparatus as claimed in claim 24, further comprising electronic circuitry adapted to predict a fault condition of said multi-phase alternating current machine if the third joint physical stator quantity falls outside a predetermined range.

26. The apparatus as claimed in claim 23, further comprising electronic circuitry adapted to predict a point in time at which a third joint physical stator quantity reaches a predetermined value, based on said trend.

27. The apparatus as claimed in claim 23, further comprising electronic circuitry adapted to determine a fault condition of said multi-phase alternating current machine if said trend deviates from a predetermined trend.

28. The apparatus as claimed in claim 27, wherein the predetermined trend corresponds to a constant joint physical stator quantity.

29. The apparatus as claimed in claim 23, wherein the first rotor position and second rotor position are different.

30. The apparatus as claimed in claim 23, wherein the physical stator quantity of each stator winding comprises any or a group of: an impedance, Z, an inductance, L, a phase angle, Fi, a resistance, R, and a ratio of an inductance, L, and a resistance, R, of each stator winding.

* * * * *